(12) United States Patent
Lin et al.

(10) Patent No.: US 7,271,431 B2
(45) Date of Patent: Sep. 18, 2007

(54) INTEGRATED CIRCUIT STRUCTURE AND METHOD OF FABRICATION

(75) Inventors: Chuan-Yi Lin, Hsin-Chu (TW);
Shien-Yang Wu, Hsin-Chu (TW);
Yee-Chia Yeo, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 10/877,441

(22) Filed: Jun. 25, 2004

(65) Prior Publication Data
US 2005/0287779 A1    Dec. 29, 2005

(51) Int. Cl.
*H01L 29/76* (2006.01)

(52) U.S. Cl. .......................... 257/288; 257/48
(58) Field of Classification Search ............... 257/288, 257/48, 692
See application file for complete search history.

(56) References Cited

U.S. PATENT DOCUMENTS

| | | | |
|---|---|---|---|
| 5,909,628 A * | 6/1999 | Chatterjee et al. | 438/424 |
| 6,074,938 A * | 6/2000 | Asamura | 438/533 |
| 6,355,524 B1 * | 3/2002 | Tuan et al. | 438/257 |
| 6,396,146 B2 | 5/2002 | Nakayama | |
| 6,406,975 B1 * | 6/2002 | Lim et al. | 438/421 |
| 6,506,673 B2 * | 1/2003 | Ma et al. | 438/622 |
| 2002/0022314 A1 * | 2/2002 | Tuan et al. | 438/239 |
| 2002/0048947 A1 * | 4/2002 | Sahara et al. | 438/682 |
| 2003/0020086 A1 * | 1/2003 | Stengel et al. | 257/103 |
| 2003/0227059 A1 * | 12/2003 | Miyake et al. | 257/350 |

* cited by examiner

*Primary Examiner*—Jerome Jackson
*Assistant Examiner*—Mohammad Timor Karimy
(74) *Attorney, Agent, or Firm*—Slater & Matsil, L.L.P.

(57) ABSTRACT

According to the present invention, the integrated circuit includes isolation field regions on a semiconductor substrate. Gate dielectrics are formed on a surface of a substrate. Gate electrodes are formed on the gate dielectrics. A photo resist is formed covering the active regions. Dummy patterns are selectively etched. A dummy substrate is selectively etched. The photo resist is then removed. A pair of spacers is formed along opposite sidewalls of the gate electrode and the gate dielectric. The source and drain are formed on the surface of said substrate and on opposite sides of the gate. Silicide is formed on the gate electrode, source, and drain. A layer of inter-level dielectric is then formed. A contact opening and metal wiring are then formed.

20 Claims, 4 Drawing Sheets

INTEGRATED CIRCUIT STRUCTURE AND METHOD OF FABRICATION

TECHNICAL FIELD

This invention relates generally to an integrated circuit, and more particularly relates to the forming of an integrated circuit using dummy patterns. More specifically, the present invention relates to a method of forming an integrated circuit without parasitic capacitance caused by dummy patterns.

BACKGROUND

Chemical Mechanical Polishing (CMP) is a process that is used for the planarization of semiconductor wafers. CMP takes advantages of the synergetic effect of both physical and chemical forces for polishing of wafers. It is done by applying a load force to the back of a wafer while it rests on a pad. Both the pad and wafer are then counter rotated while a slurry containing both abrasives and reactive chemicals is passed underneath. CMP is an effective way for achieving truly global planarization over the entire substrate.

The existence of pattern effect in films polished by CMP processes has been well known. A so-called "micro-loading effect" problem occurs due to a difference in pattern density and degrades the uniformity of pattern sizes. The "micro-loading effect" pertains to a phenomenon occurring upon simultaneously etching or polishing a region of a higher pattern density and a region of a lower pattern density: due to a difference in the etching/polishing rate of a film from one region to another, the amount of reaction produced by the etching/polishing process becomes locally dense or sparse, and convection of a large amount of reaction products causes an un-uniformity in etching rate. Large variations in effective pattern density have been shown to result in significant and undesirable post-polish film thickness variation. Particularly, this un-uniformity causes a "dishing" effect on the surface of the circuit. "Dishing" means that the surface at a location with lower pattern density was polished faster than the surface with higher pattern density, hence forming a dish shaped surface.

To counteract this effect, two methods are typically used to equalize the effective pattern density across the die. The first method is a process step known as reverse etch back, which involves using a mask to etch back raised areas. The second method is a layout design step known as dummy fill, where the circuit layout is modified and dummy patterns are added to locations with low pattern density. The adding of dummy patterns helps to achieve uniform effective pattern density across the wafer, therefore avoiding the dishing problem.

Conventionally, such dummy patterns are left in place after CMP. In the case where dummy patterns are conductive, they form parasitic capacitance with the interlayer metal wiring. The parasitic capacitance contributes to the RC time delay due to charging and discharging time. The scaling scheme of ILD and higher operation frequency for advanced processes will cause severe performance degradation due to unwanted parasitic capacitance. At the present stage of the development of the integrated circuit art, there is an increasing demand in the field of digital integrated circuits for faster switching circuits. With the switching demands of the integrated circuits going into higher frequencies, the slowing effect produced by parasitic capacitance becomes an increasing problem.

SUMMARY OF THE INVENTION

The present invention is devised to solve the aforementioned parasitic capacitance problem, and it is the object thereof to provide a method of making an integrated circuit by a CMP flattening process not accompanied by an increase of parasitic capacitance between metal wiring and dummy patterns.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method of forming an integrated circuit is described. The method solves the RC time delay problem caused by dummy pattern parasitic capacitance.

Figure 1:
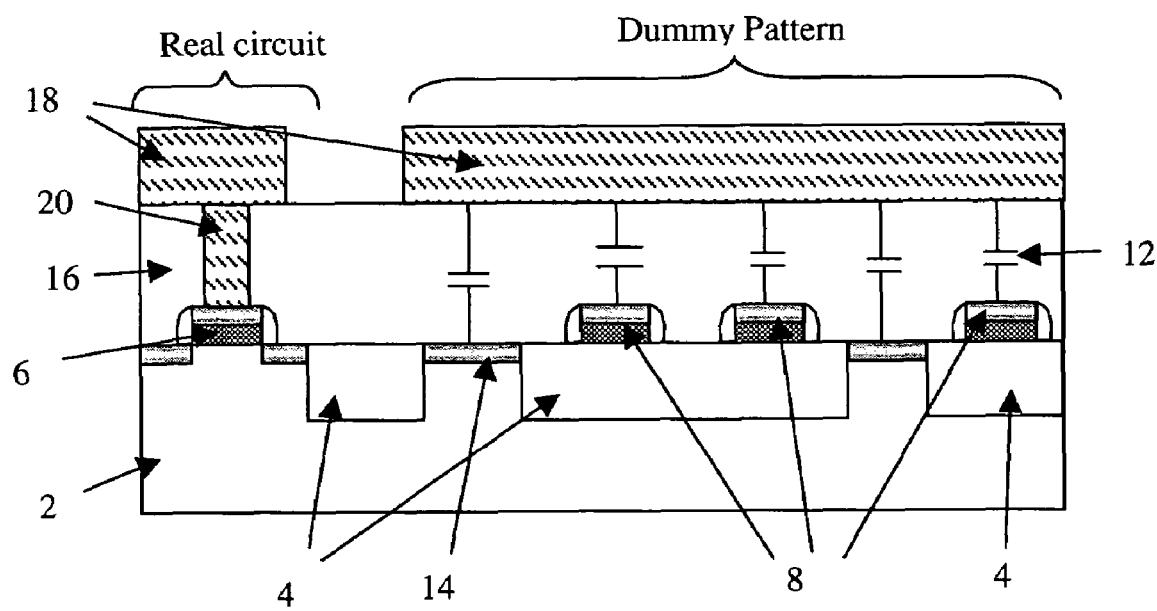
FIG. 1 is a cross-sectional view of a portion of a conventional integrated circuit with dummy patterns.

FIG. 1 illustrates a conventional integrated circuit. Isolation field regions 4 are formed in substrate 2. Isolation field regions 4 isolate and define active regions. Depending on where an active region is located, the active region is referred to as either a normal active region, which has a real device formed therein, or a dummy substrate region, which either has dummy patterns or no device formed therein. MOS transistor 6 is a real device. Devices 8 are dummy patterns. Silicide 14 is formed in the dummy substrate region. Silicide 14 is developed together with the source/drain regions of the real MOS transistor 6. After the Inter-Level Dielectric (ILD) 16 is deposited, metal plug 20 is formed through the ILD 16, and then metal wiring 18 is deposited and patterned. Note that dummy patterns 8 are not removed. Capacitors 12 exist between dummy patterns 8 and metal wiring 18, and capacitors 12 between silicide 14 and metal wiring 18. These capacitors 12 contribute to the degradation of the circuits.

Figure 2:
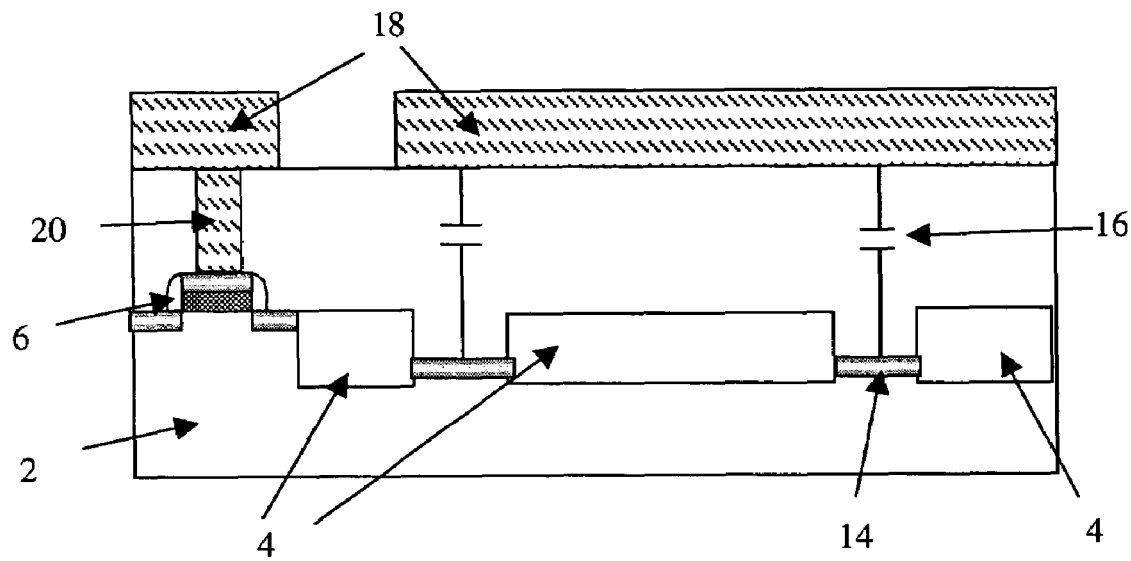
FIG. 2 is a cross-sectional view of a portion of an integrated circuit fabricated using an illustrative embodiment of the present invention.

FIG. 2 illustrates an integrated circuit formed by an illustrative embodiment of the present invention. Comparing FIG. 1 and FIG. 2, note that dummy patterns 8 are removed from the circuit and dummy silicon substrate patterns 14 are formed recessed from the original silicon surface. Therefore a significant part of parasitic capacitance has been eliminated.

Figure 3:
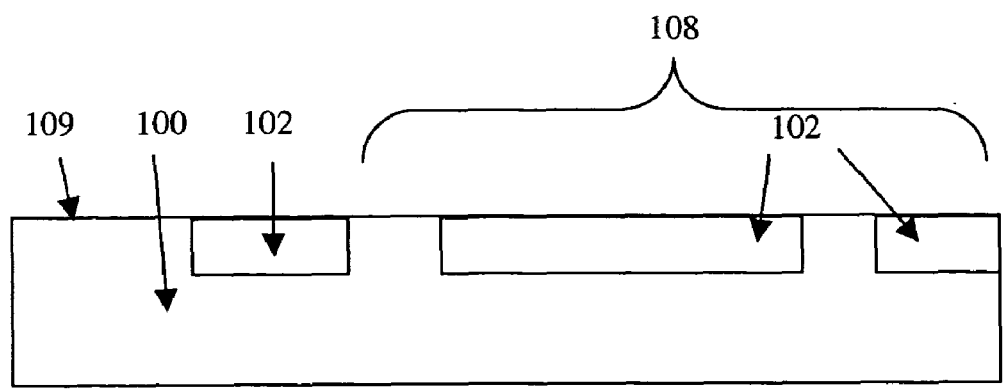
FIGS. 3 through 11 are cross-sectional views of intermediate stages in the manufacture of an integrated circuit embodying advantageous features of the present invention.

FIGS. 3-11 illustrate a preferred embodiment of the present invention. In FIG. 3, substrate 100 is preferably a semiconductor or insulator. More preferably, substrate 100 is formed of a bulk silicon wafer. In other embodiments, substrate 100 could be formed of other semiconductor or insulator materials comprising silicon, carbon, germanium, gallium, arsenic, nitrogen, aluminum, indium, and phosphorus. Substrate 100 may be in the form of a single crystal or a compound. In order to improve the performance of the device, substrate 100 is preferably strained. In other embodiments, non-strained materials can also be used.

Isolation field regions 102 are formed on substrate 100. In the preferred embodiment, isolation field regions 102 are Shallow Trench Isolations (STI). The STI regions 102 are preferably formed by etching shallow trenches in substrate 100, and filling the trenches with an insulator such as silicon oxide. The permittivity of the STI insulator is in the range of about 0.05-50, and preferably about 0.05-4. In a preferred embodiment, the STI is a stressed sheet region, i.e., the structure of the STI material causes a stress on the surrounding silicon regions. In another embodiment, the STI regions are formed of bulk materials. In order to effectively isolate the active regions, the isolation field regions have a minimum depth of about 30-650 nm, and preferably about 50-450 nm.

In another embodiment, isolation regions 102 are formed by Localized Oxidization of Silicon (LOCOS). A preferred embodiment of the LOCOS process is to pre-etch the active region, then form a layer of $Si_3N_4$ covering the active regions. An oxidation step is then performed. Regions covered with $Si_3N_4$ are protected from the oxidation, while exposed regions form a layer of $SiO_2$.

In yet another embodiment, isolation regions 102 are formed of air isolation regions. A pattern of recesses or cavities is etched in the substrate 100. Recesses are formed by etching utilizing a conventional mask such as a silicon dioxide/silicon nitride mask formed by standard photolithographic integrated circuit fabrication techniques. The mask has apertures corresponding to the recessed pattern to be formed. Then, the substrate may be etched in the conventional manner through the apertures defined in the silicon dioxide mask.

As shown in FIG. 3, isolation regions 102 are formed to isolate active regions. Active region 109 is a normal active region. Substrate region 108 is a dummy substrate region. Active regions and dummy substrate regions take a variety of shapes, such as square, rectangular, L-shape, etc. Active/non-active substrate and non-active/non-active regions are spaced apart by about 1 nm-10 μm by isolation field regions 102, and typically have a size of about 0.0001 μm²-10000 μm².

For the convenience of describing the invention, the same reference numbers are used to refer both to an active region and to its outer dimension. Outer dimension 109 is the surface of the normal active region 109. Outer dimension 108 is the surface of dummy substrate region 108.

Figure 4:
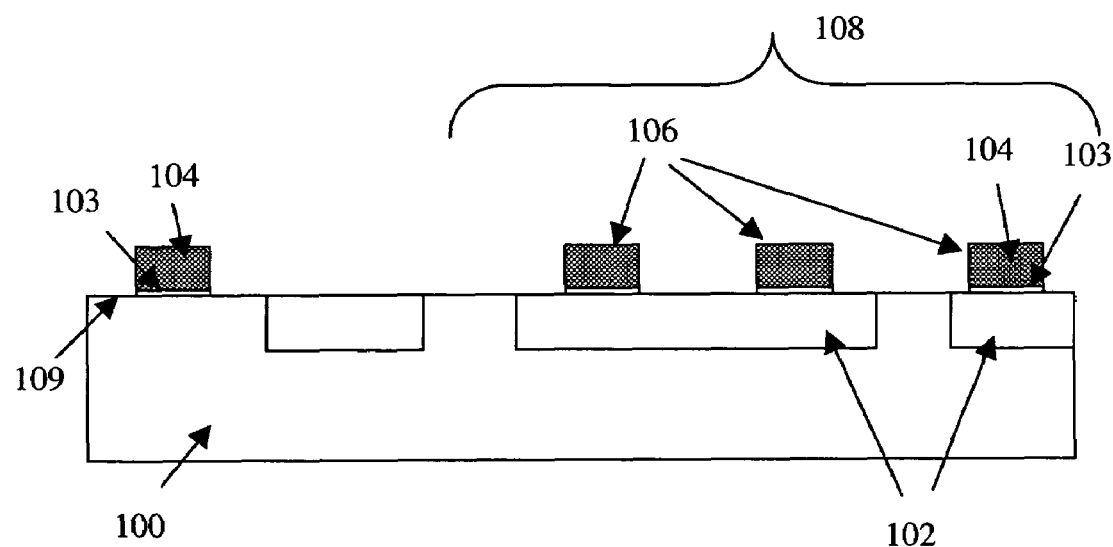

FIG. 4 illustrates the forming of gates. A gate dielectric layer 103 is formed on substrate 100, followed by a gate electrode layer 104. Gate dielectric layer 103 preferably comprises $SiO_2$, oxynitride, nitride or other high-k materials. Gate electrode layer 104 is preferably polysilicon, although it may be formed of metal, or a compound structure comprised of metal, semiconductor, metal oxide or silicide. Gate electrode layer 104 has a work function of about 2.5-6.0 eV. The gate dielectric and gate electrode are then patterned using lithography technology to form gates. Gate electrodes may be formed in normal active regions, dummy substrate regions and isolation field regions. Gate electrodes formed in dummy substrate regions 108 or isolation field regions 102 are dummy patterns. FIG. 4 shows gate electrodes 106 which are formed in isolation field regions 102.

Figure 5:
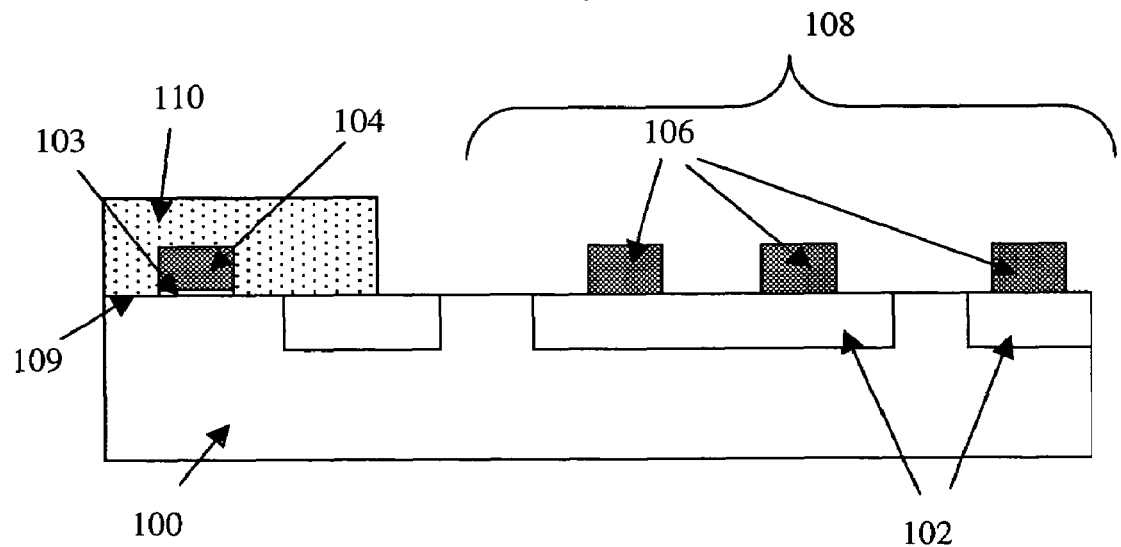

As illustrated in FIG. 5, a photo resist 110 is formed to protect the normal active regions. To effectively protect active regions from being over etched, the photo resist extends beyond the MOS transistors by about 10 nm-10 μm, and preferably by about 20 nm-3 um. Photo resist 110 has a thickness between about 10 nm and 5 μm, and preferably about 50 nm-5 μm.

Figure 6:
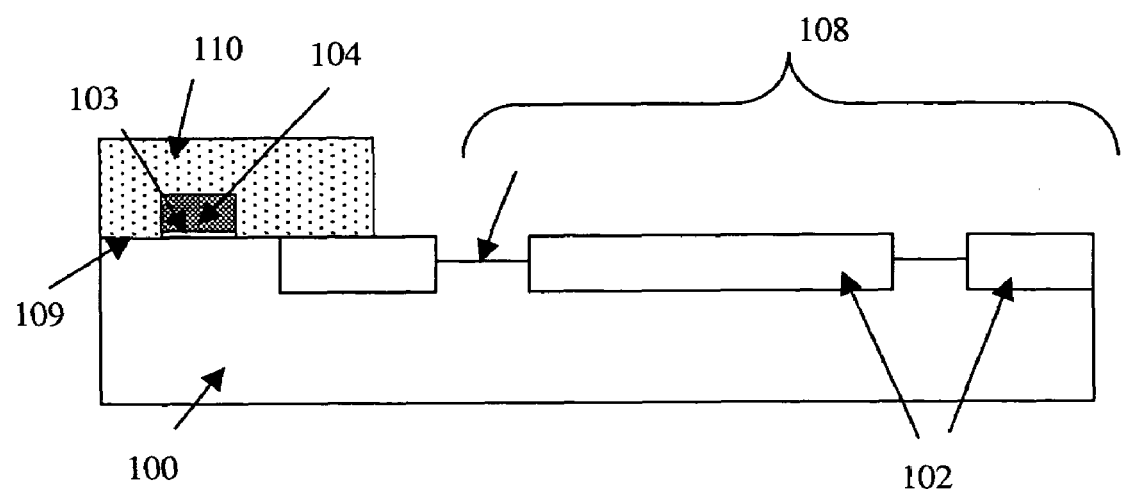

FIG. 6 illustrates the cross sectional view of the integrated circuits after the dummy patterns are removed. In the preferred embodiment, dummy patterns 106 are preferably removed selectively by wet etching using an etching solution KOH. In another embodiment, dry etching may be conducted in an ambient filled with $HBr+Cl_2+O_2$. Since outer dimension 108 is not protected by photo resist, the material under outer dimension 108 is etched anisotropically. The outer dimension 108 is etched to a depth of about 2 nm-500 nm, and preferably about 10-200 nm. Since a selective etching is used, the loss in the outer dimension 108 and the loss in the isolation region 102 are different. The loss in isolation field region 102 is about 10-300 nm, and preferably about 10-100 nm. In another embodiment, dummy electrodes 106 are removed after spacers 112 are formed (see FIG. 7).

In the preferred embodiment, dummy substrate 108 is etched at the same time the dummy patterns 106 are etched. In other embodiments, dummy substrate 108 can be removed before gate electrode 104 is formed, after gate electrode 104 is formed, or after the spacers 112 are formed.

Figure 7:
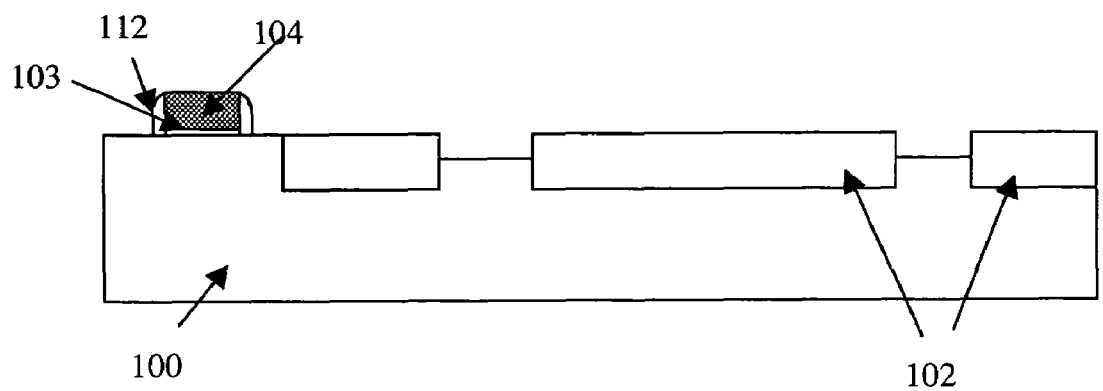

As shown in FIG. 7, the photo resist 110 is removed. As is well known in the art, photo resist may be removed in a tunnel reactor in the presence of the oxygen plasma. A pair of spacers 112 is then formed along the sidewalls of the gate dielectric 103 and gate electrode 104. Spacers 112 serve as self-aligning masks for a subsequent salicidation process, as described below. The spacers 112 may be formed by well-known methods such as blanket depositing a dielectric layer over the entire region including substrate 100 and gate electrode 104, then anisotropically etching to remove the dielectric layer from horizontal surfaces and leaving the spacers 112.

Figure 8:
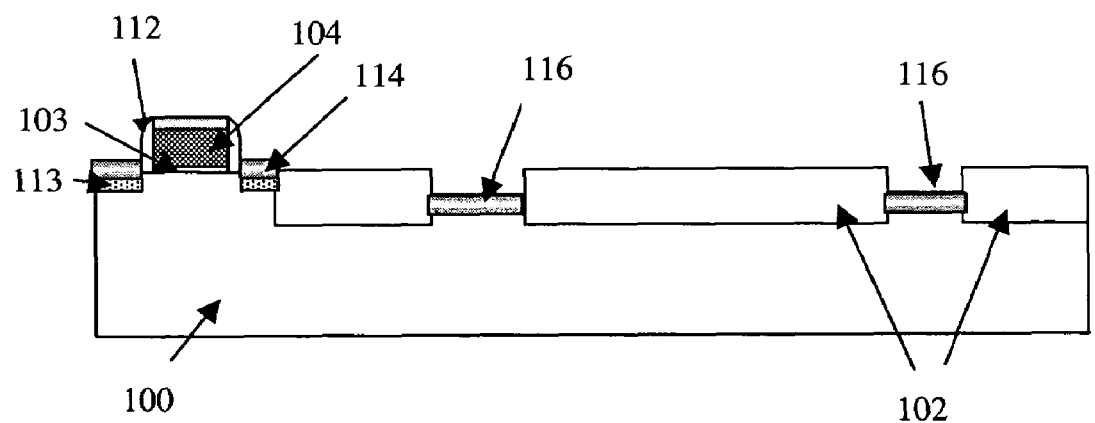

FIG. 8 illustrates the formation of the source and drain regions. For a raised source/drain MOS scheme, semiconductor 113 is epitaxially deposited to a thickness of about 400 Å-600 Å. Semiconductor 113 forms the source and drains for the resulting MOS transistor, so it is alternatively referred as source and drain region 113. A preferred method of forming semiconductor 113 is selective epitaxy. An $SiO_2$ layer is formed to cover substrate 100. Openings are then formed through $SiO_2$ to expose source/drain regions. Semiconductor 113 is then epitaxially grown. Semiconductor 113 is preferably formed using Molecular Beam Epitaxy (MBE), although other deposition techniques, including Chemical Vapor Deposition (CVD), Ultra High Vacuum Chemical Vapor Deposition (UHVCVD), Atomic Layer Chemical Vapor Deposition (ALCVD) or Metal Organic Chemical Vapor Deposition (MOCVD) can also be used. Deposition preferably occurs at a temperature in the range of 300° C.-950° C., and more preferably in the range of 450° C. to 850° C., and at a pressure less than 100 mTorr. In the region where a single crystal substrate is exposed, semiconductor 113 is grown epitaxially. On the $SiO_2$ layer, a poly-crystal is formed. The poly-crystal and $SiO_2$ are then etched, leaving only the source and drain and poly gate regions. Source/drain regions are finally defined by implant and thermal annealing.

As illustrated in FIG. 8, metal silicide 114 is formed over the source and drain regions and preferably over gate electrode 104 as well. The thickness of metal silicide 114 is preferably less than about 500 Å. Metal silicide 114 may be a transition metal or metal compound such as Nickel, titanium, cobalt, tungsten, tantalum, or the like or some other appropriate conductive material deposited via Chemical Vapor Deposition (CVD), Physical Vapor Deposition (PVD) or other alternatives. Layer 114 will be referred to interchangeably as a metal layer or a silicide layer in the ensuing discussion. It should be recognized that, depending upon the embodiment, layer 114 could be either a metal layer, or could be a silicide that was formed from a metal layer that has inter-reacted with the underlying semiconductor regions.

In the preferred embodiments, metal 114 is a metal silicide. The metal silicide may take the form of transition-metal silicide and may contain more than one transition metal. In one preferred embodiment, metal layer 114 is formed by first depositing a thin composite layer of metal, such as titanium, cobalt, nickel, tungsten, or the like with TiN capped, over the device, including the exposed surfaces of the semiconductor 113 and the gate electrode 104. The device is then annealed to form a silicide between the deposited metal and the underlying exposed silicon regions (specifically source/drain regions and polysilicon gate electrode 104). The resulting metal silicide regions are illustrated as metal layer 114 in FIG. 8. Preferably, the resulting silicide layer 114 is in the range of 50 Å to 500 Å thick, although the desired thickness is a matter of design choice. In yet another embodiment, silicide layer 114 could be formed by the deposition of a silicide such as cobalt silicide or nickel silicide directly onto the surface of source and drain regions and gate electrode 104 using known deposition techniques, such as CVD.

At the same time the silicide 114 is formed, silicide 116 is also formed on outer dimension 108 in the dummy substrate region. In previous steps, the dummy substrate 108 has been recessed. This increases the distance between the silicides and metal wiring, therefore reducing the capacitance between the silicides and metal wiring.

Figure 9:
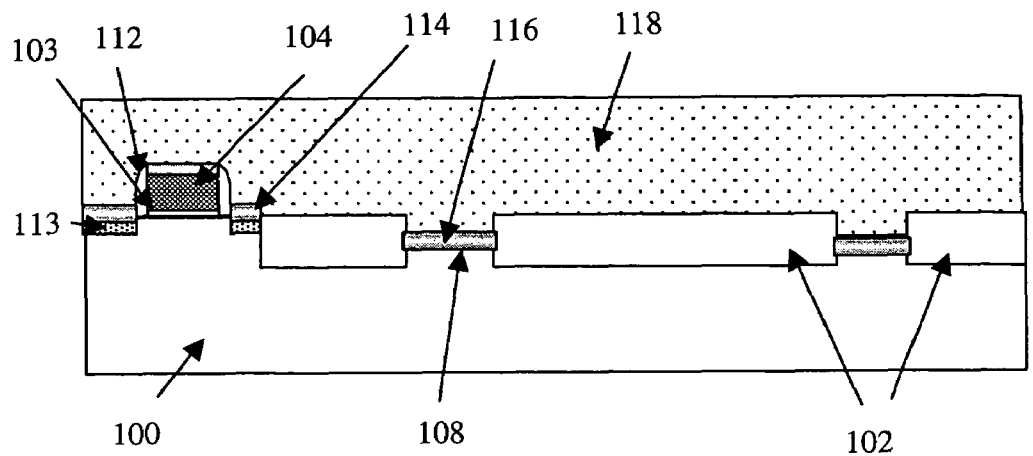

As illustrated in FIG. 9, an inter-level dielectric (ILD) 118, also sometimes known as a Pre-Metal Dielectric (PMD) or an Inter-Metal Dielectric (IMD) layer is deposited over the surface of the circuit. This ILD layer 118 is conventionally silicon oxide deposited using, e.g., CVD, Spin on Coating, PECVD, HDPCVD, LPCVD, or other well known deposition techniques. The ILD layer comprises conventionally silane-based silicon oxide, SiON, SiN, SOG, doped silicon oxide or TEOS-based silicon oxide. The ILD layer also preferably comprises low-k material, for example, Fluorinated Silicate Glass (FSG), Polyimides, Hydrogen Silsesquioxane (HSQ), Methylated Silsesquioxane (MSQ), Methylated Silica, Fluorinated Amorphous Carbon (α-C:F), PTFE (Teflon), porous organics and porous Inorganics (Xerogels, Templated Silica). This ILD layer 118 will provide insulation between the transistor and overlying metal wiring that will be formed subsequently. A photo resist material (not shown) will be formed and patterned over the ILD layer 118 in order to form contact openings to the source and drain regions and the gate dielectric.

Figure 10:
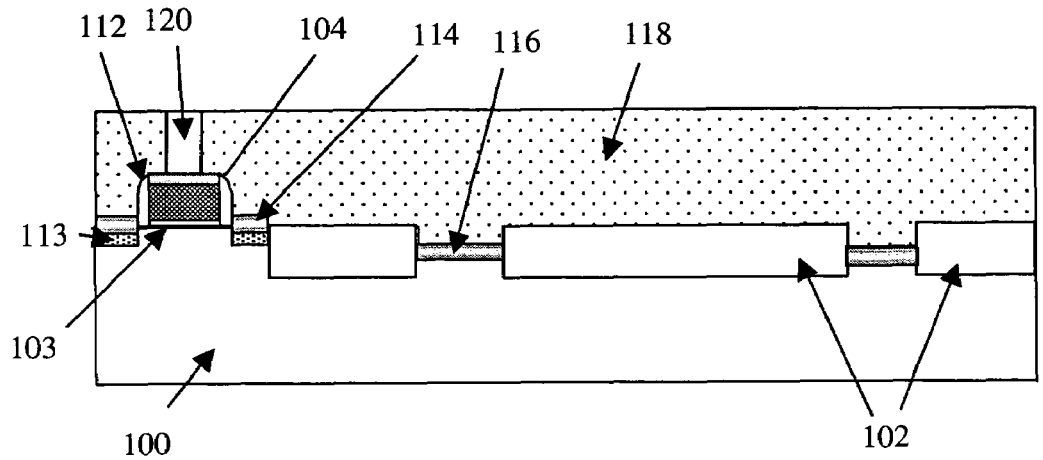

FIG. 10 illustrates the integrated circuit after the exposed portions of the ILD 118 have been etched away, thus opening contact openings in the ILD dielectric layer.

Figure 11:
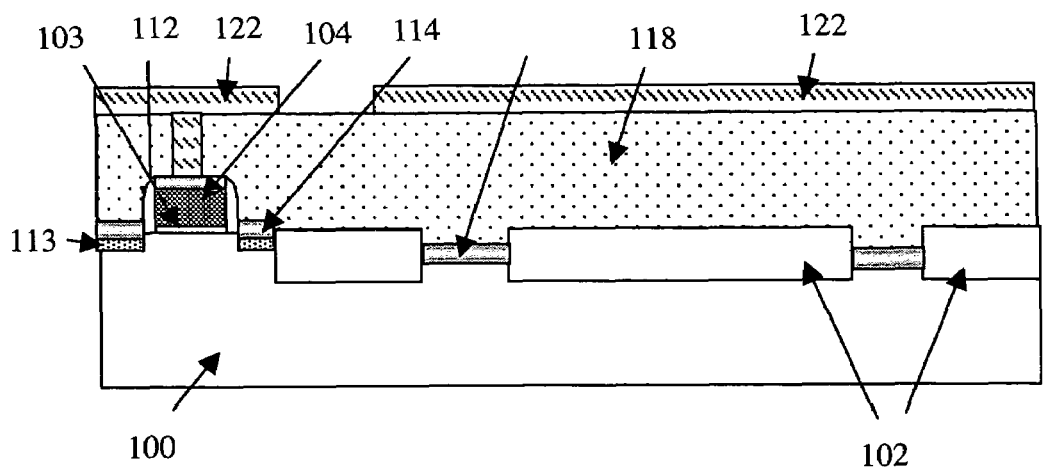

FIG. 11 illustrates the device after a metal plug 120 has been formed in the contact openings. Metal plug 120 may be formed of tungsten, aluminum, copper, or other well-known alternatives. Metal plug 120 may also be a composite structure, including, e.g., barrier and adhesion layers, such as formed of titanium/titanium nitride or tantalum nitride, and other layers as well.

A metal wiring film 122 is formed on the surface of ILD by using sputtering. The sputtering deposits a titanium/tungsten film to a thickness between 20 nm and 500 nm, and preferably about 300 nm. Lithographic technology and Reactive Ion Etching (RIE) are then used to pattern the metal wiring 122.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure, comprising:
   a semiconductor substrate having a top surface;
   isolation field regions formed extending from said top surface of said semiconductor substrate into the semiconductor substrate;
   a dummy substrate region separated by said isolation field regions from remaining portions of said semiconductor substrate, wherein said dummy substrate region has a top surface recessed from said top surface of said semiconductor substrate, and wherein said top surface of said dummy substrate region is substantially flat across its entirety;
   a first silicide layer on said top surface of said dummy substrate region;
   a normal active region separated by said isolation field regions from remaining portions of said semiconductor substrate wherein said normal active region has a surface that is substantially coplanar with said semiconductor substrate top surface;
   a gate dielectric formed on said semiconductor substrate top surface and within said normal active region; and
   a gate electrode formed on said gate dielectric.

2. The integrated circuit structure of claim 1 further comprising:
   a pair of spacers formed along opposite sidewalls of said gate electrode and said gate dielectric;
   a source region and a drain region formed in said normal active region adjacent said gate electrode;

a second silicide layer formed on said source region, said drain region, and said gate electrode;
an Inter-Level Dielectric (ILD) formed over said normal active region, said dummy substrate region and said isolation field regions;
a conductive plug formed in said ILD and contacting said gate electrode; and
a metal wiring layer formed on said ILD.

3. The integrated circuit structure of claim 2 wherein said second silicide layer has a work function of between about 2.5 eV and about 6.0 eV.

4. The integrated circuit structure of claim 1 wherein said recessed top surface of said dummy substrate region is recessed from said top surface of said semiconductor substrate by about 2 nm to 500 nm.

5. The integrated circuit structure of claim 4 wherein said recessed top surface of said dummy substrate region is recessed from said top surface of said semiconductor substrate by about 10 nm to 200 nm.

6. The integrated circuit structure of claim 1 wherein said isolation field regions are shallow trench isolation regions.

7. The integrated circuit structure of claim 6 wherein said shallow trench isolation regions are filled with a material comprising a material selected from the group consisting essentially of silicon, oxygen, and nitrogen, and combinations thereof, and wherein said shallow trench isolation regions have a permittivity between about 0.05 and 50.

8. The integrated circuit structure of claim 1 has a Semiconductor-On-Insulator structure.

9. The integrated circuit structure of claim 1 wherein said semiconductor substrate is in a form selected from a group consisting of single crystal, poly crystal, and amorphous.

10. The integrated circuit structure of claim 1 wherein said isolation field regions are formed by local oxidation of silicon.

11. The integrated circuit structure of claim 1 wherein said isolation field regions are air isolation regions.

12. The integrated circuit structure of claim 1 wherein:
said normal active region and said dummy substrate region are spaced apart by about 1 nm to 1 µm;
said normal active region has a size of between about 0.0001 µm$^2$ and about 10000 µm$^2$; and
said dummy substrate region is recessed between about 2 nm and 500 nm.

13. The integrated circuit structure of claim 1 wherein said gate electrode comprises a material selected from the group consisting essentially of semiconductor, metal oxide and silicide, and combinations thereof, and wherein said gate electrode has a work function between about 2.5 and 6.0 eV.

14. The integrated circuit structure of claim 1 wherein said semiconductor substrate is a compound comprising a material selected from the group consisting essentially of silicon, carbon, germanium, gallium, arsenic, nitrogen, aluminum, indium, phosphorous, and combinations thereof.

15. The integrated circuit structure of claim 1 further comprising:
an Inter-Level Dielectric (ILD) formed over said gate electrode, said dummy substrate region and said isolation field regions; and
a metal wiring layer formed on said ILD, wherein a space directly over said top surface of said dummy substrate region but below said metal wiring layer is filled with said ILD and said first silicide layer only.

16. The integrated circuit structure of claim 1, wherein an entire top surface of said first silicide layer is lower than said top surface of said semiconductor substrate.

17. An integrated circuit structure, comprising:
a semiconductor substrate having a top surface;
isolation field regions occupying portions of said semiconductor substrate, wherein said isolation field regions extend from said top surface of said semiconductor substrate into the semiconductor substrate, and wherein said isolation field regions separate remaining portions of said semiconductor substrate into sub regions comprising a dummy region and an active region, and wherein said dummy region has a top surface recessed from said top surface of said semiconductor substrate;
a first silicide layer on said top surface of said dummy region;
a gate dielectric formed on said top surface of said semiconductor substrate and within said active region;
a gate electrode formed on said gate dielectric;
an Inter-Level Dielectric (ILD) formed over said gate electrode, said dummy region and said isolation field regions; and
a metal wiring layer formed on said ILD, wherein a space directly over a top surface of said dummy region and below said metal wiring layer is substantially filled with said ILD and said first silicide layer.

18. The integrated circuit structure of claim 17 further comprising:
a source region and a drain region formed in said active region adjacent said gate electrode;
a second silicide layer formed on said source region and said drain region; and
a conductive plug formed in said ILD and electrically coupled to said gate electrode.

19. The integrated circuit structure of claim 17, wherein an entire top surface of said dummy region is substantially flat.

20. The integrated circuit structure of claim 17, wherein an entire top surface of said first silicide layer is lower than said top surface of said semiconductor substrate.

* * * * *